US012796384B2

(12) United States Patent
Jung et al.

(10) Patent No.: US 12,796,384 B2
(45) Date of Patent: Nov. 10, 2026

(54) SUBSTRATE TRANSFER DEVICE AND SUBSTRATE TRANSFER METHOD

(71) Applicant: SEMES CO., LTD., Cheonan-si (KR)

(72) Inventors: Sung Jae Jung, Seoul (KR); Bo Soon Jang, Yongin-si (KR)

(73) Assignee: Semes Co. , LTD., Cheonan-si (KR)

( * ) Notice: Subject to any disclaimer, the term of this patent is extended or adjusted under 35 U.S.C. 154(b) by 227 days.

(21) Appl. No.: 18/427,003

(22) Filed: Jan. 30, 2024

(65) Prior Publication Data

US 2024/0321615 A1 Sep. 26, 2024

(30) Foreign Application Priority Data

Mar. 22, 2023 (KR) ........................ 10-2023-0037276

(51) Int. Cl.
*H10P 72/30* (2026.01)

(52) U.S. Cl.
CPC ...... *H10P 72/3221* (2026.01); *H10P 72/3402* (2026.01); *H10P 72/3408* (2026.01)

(58) Field of Classification Search
CPC ......... H01L 21/67733; H01L 21/67736; H01L 21/67775; H04N 2201/03179
USPC .............. 650/3; 52/39; 108/42, 48; 212/332; 414/281, 940
See application file for complete search history.

(56) References Cited

U.S. PATENT DOCUMENTS

2004/0109746 A1* 6/2004 Suzuki .............. H01L 21/67733 414/373
2011/0158776 A1* 6/2011 Inui .................. H01L 21/67769 414/277
2018/0076079 A1 3/2018 Abe et al.
2022/0186554 A1* 6/2022 Choi ................ H01L 21/67733

FOREIGN PATENT DOCUMENTS

JP WO 201260917 A1 * 11/2012 ....... H01L 21/67736
JP 5088468 B2 12/2012
KR 10-2004-0076989 A 9/2004
KR 10-2008-0072817 A 8/2008
KR 10-2018-0028974 A 3/2018
KR 10-2020-0063659 A 6/2020
KR 10-2022-0026360 A 3/2022

OTHER PUBLICATIONS

Translation Korean Office Action dated Apr. 20, 2026 issued in corresponding Korean Application No. KR 10-2023-0037276.*
Korean Office action dated Apr. 30, 2026 issued in corresponding Korean Patent Application No. 10-2023-0037276.

* cited by examiner

*Primary Examiner* — Saul Rodriguez
(74) *Attorney, Agent, or Firm* — Harness, Dickey & Pierce, P.L.C.

(57) ABSTRACT

The substrate transfer device includes an Overhead Hoist Transport (OHT) for transferring a container while autonomously travelling along a rail, and a loading unit including loading areas in a plurality of layers, each one of the loading areas being configured to receive one of the plurality of containers, the loading unit including shelf parts, each one of
(Continued)

the shelf parts including the loading area, each one of the shelf parts including a loading detection sensor configured to detect one of the containers being loaded on a respective one of the shelf parts and generate a loading signal.

13 Claims, 16 Drawing Sheets

SUBSTRATE TRANSFER DEVICE AND SUBSTRATE TRANSFER METHOD

CROSS-REFERENCE TO RELATED APPLICATIONS

This application claims priority to and the benefit of Korean Patent Application No. 10-2023-0037276 filed in the Korean Intellectual Property Office on Mar. 22, 2023 the entire contents of which are incorporated herein by reference.

TECHNICAL FIELD

The present invention relates to a substrate transfer device and a substrate transfer method, and more particularly, to a substrate transfer device and a substrate transfer method of transferring a substrate.

BACKGROUND ART

Semiconductor manufacturing technology is responding to the rapidly changing pace of technological innovation and the rapidly changing environment as technology-intensive future technologies converge, and in particular, as semiconductor devices become more integrated and high-performance products are developed, even the logistics technology of the semiconductor manufacturing process is pursuing more efficient technologies.

These semiconductor manufacturing logistics flows are being managed according to site conditions by resolving bottlenecks, improving equipment failures, and Preventive Maintenance (PM).

In accordance with this semiconductor manufacturing logistics flow, semiconductor fabs use Overhead Hoist Transport (OHT) to carry out various logistics transfers, and in this case, OHTs are operated in large quantities on rails, and to control and manage the OHTs, there is an OHT Control System (OCS) that controls and manages all OHTs.

Meanwhile, the OHT as described above transfers a container on which a substrate is mounted to each semiconductor facility performing each process. In this case, when the OHT cannot mount the container because the semiconductor facility is operating, the container is temporarily loaded into a Side Track Buffer (STB).

In this case, the conventional side track buffer is formed in the form of a frame divided into one or several spaces in the horizontal direction. Accordingly, since the side track buffer in the related art can accommodate only one to several containers when loaded, there is a problem in that the capacity to accommodate containers is very low.

The side track buffer in the related art is mainly installed between rails along which the OHT moves, but in this case, the space between the rails is very narrow. Therefore, the side track buffer has many problems in that it is difficult to increase the accommodation capacity due to the narrow space.

Additionally, the side track buffer in the related art is shaken during loading and unloading of containers. In addition, the side track buffer in the related art is installed on the semiconductor ceiling surface to receive vibration generated when the OHT moves.

In this case, when the height from the bottom to the top of the side track buffer in the related art is increased, the excitation width also increases. Therefore, since the substrate accommodated in the container is shaken by vibration and the possibility of burnout increases, the height that can be increased in the side track buffer in the related art is very limited.

SUMMARY OF THE INVENTION

A technical object of the present invention to solve the foregoing problems is to provide a substrate transfer device and a substrate transfer method, which may load more containers even in a narrow space when an Overhead Hoist Transport (OHT) temporarily loads containers.

Another technical object of the present invention to solve the foregoing problems is to provide a substrate transfer device and a substrate transfer method, which utilize a loading area for other purposes by selectively removing the loading area where containers are temporarily loaded as needed.

Still another technical object of the present invention to solve the foregoing problems is to provide a substrate transfer device and a substrate transfer method, which may minimize the influence of vibration of an OHT even when multiple containers are loaded in multiple layers.

The object of the present invention is not limited thereto, and other objects not mentioned will be clearly understood by those of ordinary skill in the art from the following description.

An exemplary embodiment of the present invention provides a substrate transfer device including: an Overhead Hoist Transport (OHT) for transferring a container while autonomously travelling along a rail; and a loading unit providing a plurality of layers of loading areas in which the container is loaded.

According to the exemplary embodiment, in the loading unit, the loading area of each of the plurality of layers may be folded about one point.

According to the exemplary embodiment, the loading unit may include: a support part fixedly installed within a semiconductor fab; and shelf parts formed in plural, each of the shelf parts having the loading area, the plurality of shelf parts being installed while being spaced apart from each other from a top to a bottom of the support part, and the loading area being rotated and folded.

According to the exemplary embodiment, the support part may be installed with an upper end connected to a ceiling surface within the semiconductor fab and a lower end connected to a floor surface within the semiconductor fab.

According to the exemplary embodiment, the support part may be installed while being connected to a wall surface in the semiconductor fab.

According to the exemplary embodiment, the support part may be coupled only to one side of the loading unit.

According to the exemplary embodiment, the shelf part may include: base parts formed in plural, the plurality of base parts being installed while being spaced apart from the top to the bottom of the support part; and rotary loading parts formed in plural, the plurality of rotary loading parts being rotatably coupled to the base parts, respectively, in which the container is loaded.

According to the exemplary embodiment, the rotary loading part may include: a loading plate which is rotatably coupled to the base part and on which the container is loaded; and a sliding transfer body which is slidably coupled to the loading plate and is slidably driven in one direction of the loading plate.

According to the exemplary embodiment, the rotary loading part may further include a rotary driving unit installed at a rotating point between the base part and the rotary loading part to rotate and fold the rotary loading part toward the base part according to a rotation angle.

According to the exemplary embodiment, the shelf part may further include a loading detection sensor which is installed on the sliding transfer body and detects the container when the container is loaded and generates a loading signal.

According to the exemplary embodiment, the substrate transfer device may further include an OHT Control System (OCS) which is interlocked with the loading detection sensor and receives the loading signal from the loading detection sensor when the container is loaded to determine whether the container is loaded, and, is interlocked with the rotary driving unit and folds the entire rotary loading parts when the container is not present within the loading area of the loading unit.

According to the exemplary embodiment, the OCS may cause the container to be loaded in a state where the sliding transfer body moves forward from the loading plate.

According to the exemplary embodiment, the OCS may receive a loading signal from the loading detection sensor when the container is completely loaded, and slide the sliding transfer body toward the loading plate when the loading signal is input.

According to the exemplary embodiment, the loading units may be formed in plural and are arranged in at least two rows.

According to the exemplary embodiment, the OHT may include: a main body traveling along a rail; a lifting/lowering unit coupled to the main body and driven up and down to the loading area; and a gripper unit coupled to the lifting/lowering unit and for gripping the container or releasing gripping.

According to the exemplary embodiment, in the loading unit, a location of the loading area may be varied when the container is loaded to or unloaded from the loading area of each of the plurality of layers.

Another exemplary embodiment of the present invention provides a substrate transfer method including: a loading signal generating operation of transmitting a loading signal from each of loading detection sensors to an Overhead Hoist Transport (OHT) Control System (OCS); a loading area searching operation of searching for, by the OCS, a loading area in which the container is to be loaded among loading areas of a loading unit based on presence or absence of the loading signal; a first moving-forward operation of selecting any one of sliding transfer bodies in which the containers are not loaded and moving the selected sliding transfer body to one side; a first placing operation of placing, by the OCS, an OHT at an upper portion in which the sliding transfer body is located by controlling the OHT; a container lowering operation of seating, by the OCS, the container onto the sliding transfer body by controlling the OHT; a gripping releasing operation of releasing gripping between the OHT and the container by controlling the OHT; a gripper lifting operation of lifting the gripper unit into a main body of the gripper unit by controlling the OHT; and a first reversing operation of inserting, by the OCS, the sliding transfer body on which the container is seated into a loading plate by controlling the sliding transfer body.

According to the exemplary embodiment, the substrate transfer method may further include: a transfer container selecting operation of selecting any one of the containers placed in the loading areas of the loading unit when a transfer command for the container is input to the OCS by transfer scheduling; a second moving-forward operation of driving, by the OCS, the sliding transfer body on which the container is seated to slide to one side, and moving the container selected in the transfer container selecting operation; a second placing operation of placing, by the OCS, the OHT on a top of the container selected in the transfer container selecting operation by controlling the OHT; a gripper lowering operation of lowering, by the OCS, a gripper of the OHT to the container selected in the transfer container selecting operation by controlling the OHT: a gripping operation of causing, by the OCS, the OHT to grip the container by controlling the OHT; a container lifting operation of lifting, by the OCS, the gripper unit and the container to an inside of a main body by controlling the OHT; and a second reversing operation of inserting the sliding transfer body into a loading plate by controlling the sliding transfer body.

According to the exemplary embodiment, the substrate transfer method may further include a shelf folding operation of folding, by the OCS, a rotary loading part on a base part when no loading signal is generated by all of the loading detection sensors.

Still another exemplary embodiment of the present invention provides a substrate transfer device including: an Overhead Hoist Transport (OHT) including a main body traveling along a rail, a lifting/lowering unit coupled to the main body and driven up and down to the loading area, and a gripper unit coupled to the lifting/lowering unit and for gripping the container or releasing gripping; a support part installed with an upper end connected to a ceiling surface within a semiconductor fab and a lower end connected to a floor surface within the semiconductor fab or connected to a wall surface in the semiconductor fab; a shelf part including base parts formed in plural, each of the plurality of base parts being spaced apart from a top to a bottom of the support part, rotary loading parts formed in plural, each of the plurality of rotary loading parts being rotatably coupled to the base parts, respectively, in which the container is loaded, and a loading detection sensor which is installed on the sliding transfer body and detects the container when the container is loaded and generates a loading signal; and an OHT Control System (OCS) which causes the container to be loaded in a state where the sliding transfer body moves forward from the loading plate, receives a loading signal from the loading detection sensor when the container is completely loaded and slides the sliding transfer body to the loading plate when the loading signal is input, and is interlocked with the loading detection sensor and receives the loading signal from the loading detection sensor when the container is loaded to determine whether the container is loaded, and is interlocked with the rotary driving unit and folds the entire rotary loading parts when the container is not present within the loading area of the loading unit, in which the rotary loading part includes a loading plate which is rotatably coupled to the base part and on which the container is loaded, a sliding transfer body which is slidably coupled to the loading plate and is slidably driven in one direction of the loading plate, and a rotary driving unit installed at a rotating point between the base part and the rotary loading part to rotate and fold the rotary loading part toward the base part according to a rotation angle.

The present invention provides a multi-layered loading area in the loading unit, allowing the OHT to load more containers in a smaller space when temporarily loading containers.

Furthermore, the present invention selectively removes the loading area for temporarily loading containers as needed, thereby achieving the effect of utilizing the loading area for other purposes.

Furthermore, the present invention has the effect of minimizing the impact of vibration of the OHT even when multiple containers are loaded in multiple layers.

The effect of the present invention is not limited to the foregoing effects, and non-mentioned effects will be clearly understood by those skilled in the art from the present specification and the accompanying drawings.

DETAILED DESCRIPTION

Figure 1:
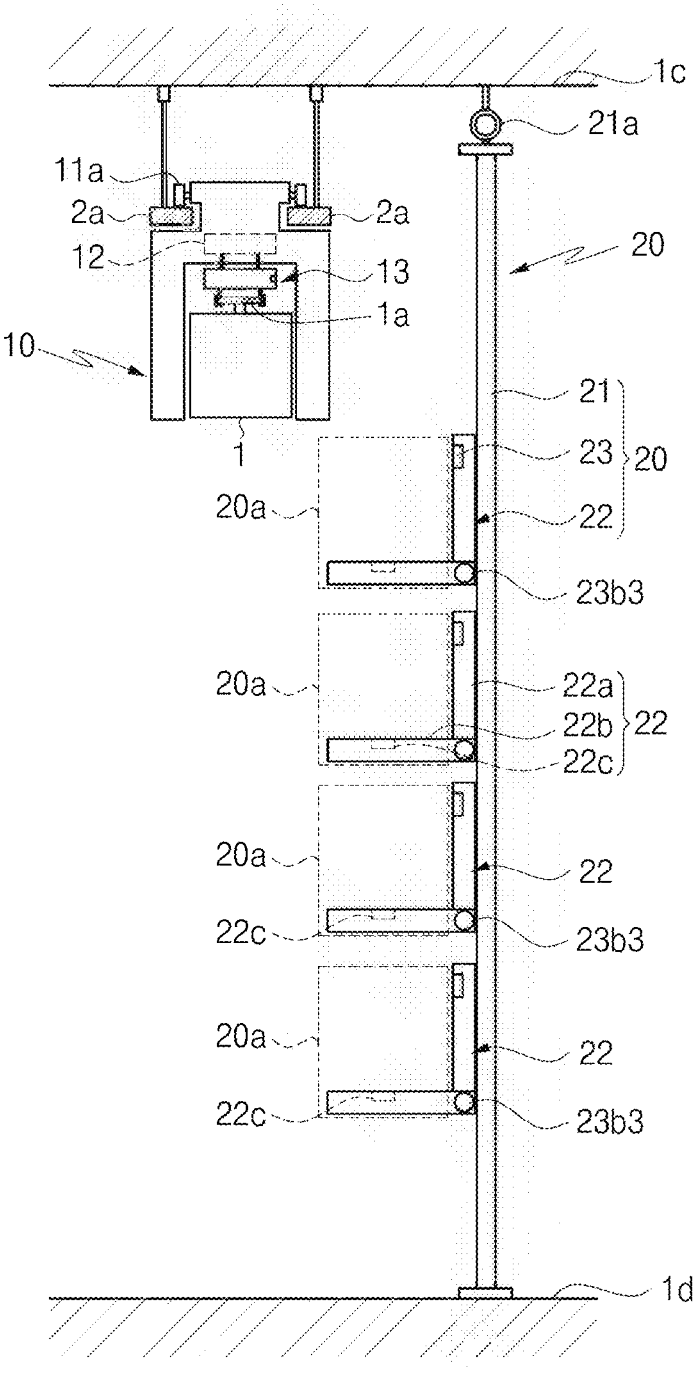
FIG. 1 is a side view schematically illustrating a substrate transfer device according to an exemplary embodiment of the present invention.

Example embodiments will now be described more fully with reference to the accompanying drawings. Example embodiments are provided so that this disclosure will be thorough and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

When the term "same" or "identical" is used in the description of example embodiments, it should be understood that some imprecisions may exist. Thus, when one element or value is referred to as being the same as another element or value, it should be understood that the element or value is the same as the other element or value within a manufacturing or operational tolerance range (e.g., ±10%).

When the terms "about" or "substantially" are used in connection with a numerical value, it should be understood that the associated numerical value includes a manufacturing or operational tolerance (e.g., ±10%) around the stated numerical value. Moreover, when the words "generally" and "substantially" are used in connection with a geometric shape, it should be understood that the precision of the geometric shape is not required but that latitude for the shape is within the scope of the disclosure.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Figure 2:
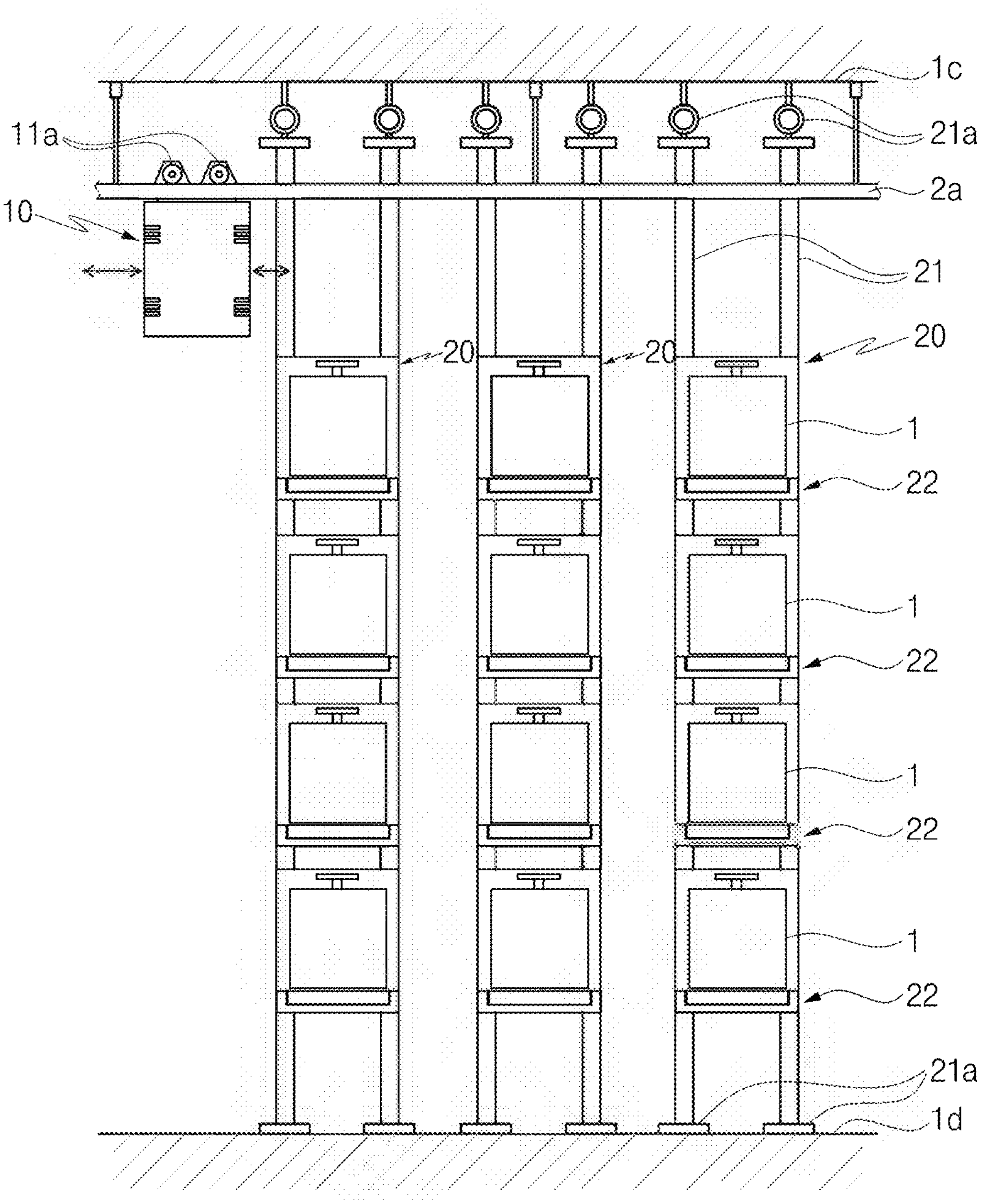
FIG. 2 is a front view of the substrate transfer device illustrated in FIG. 1.
Figure 3:
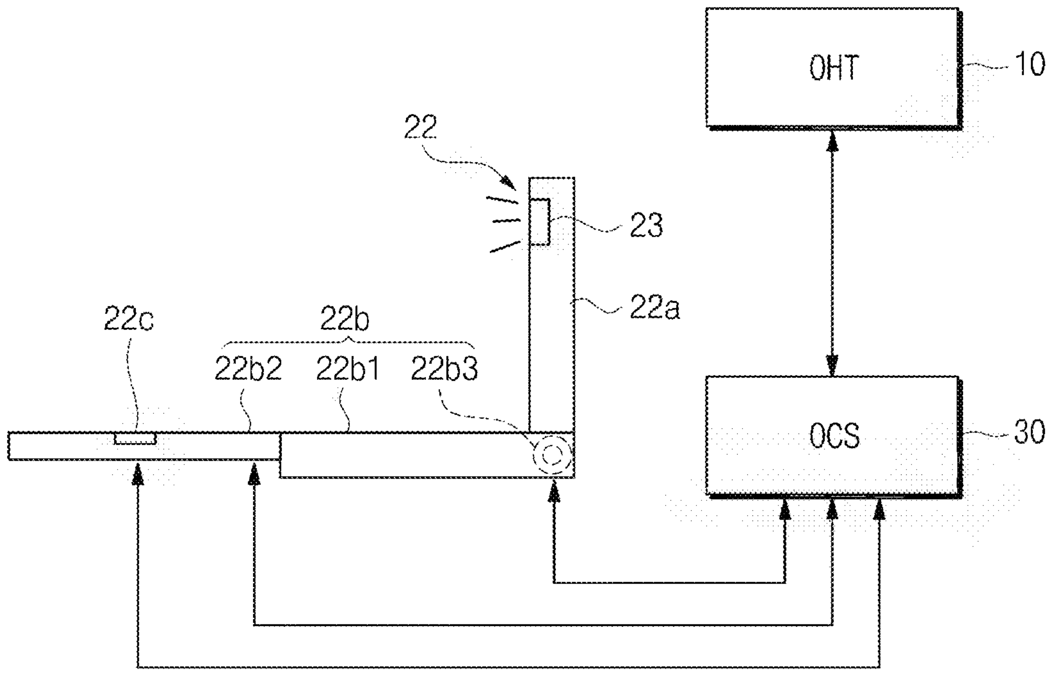
FIG. 3 is a configuration diagram illustrating an electronic connection relationship of the substrate transfer device illustrated in FIG. 1.
Figure 4:
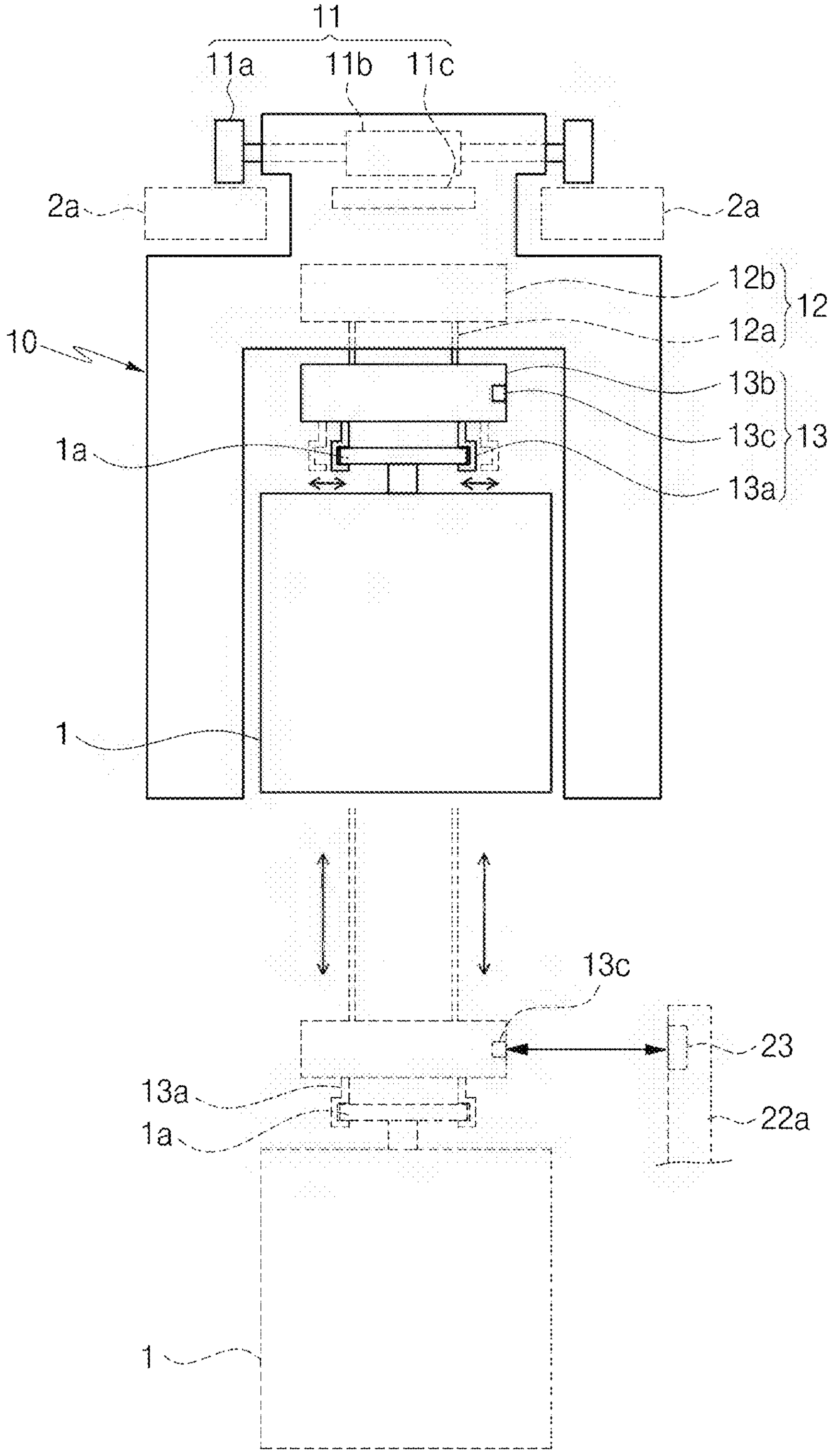
FIG. 4 is an enlarged side view of an Overhead Hoist Transport (OHT) illustrated in FIG. 1.
Figure 5:
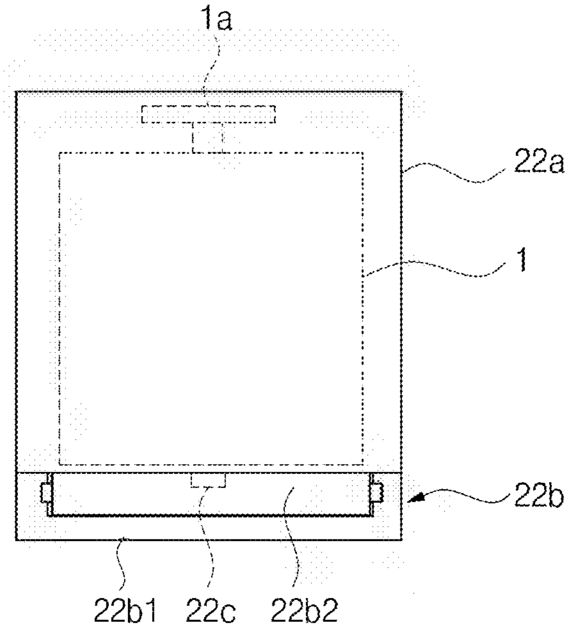
FIG. 5 is an enlarged front view of a shelf part illustrated in FIG. 2.
Figure 6:
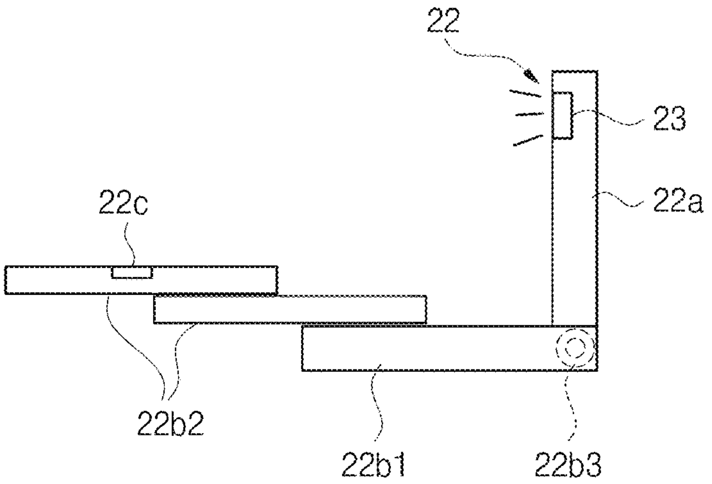
FIG. 6 is a side view of a modified example of the shelf part illustrated in FIG. 1.
Figure 7:
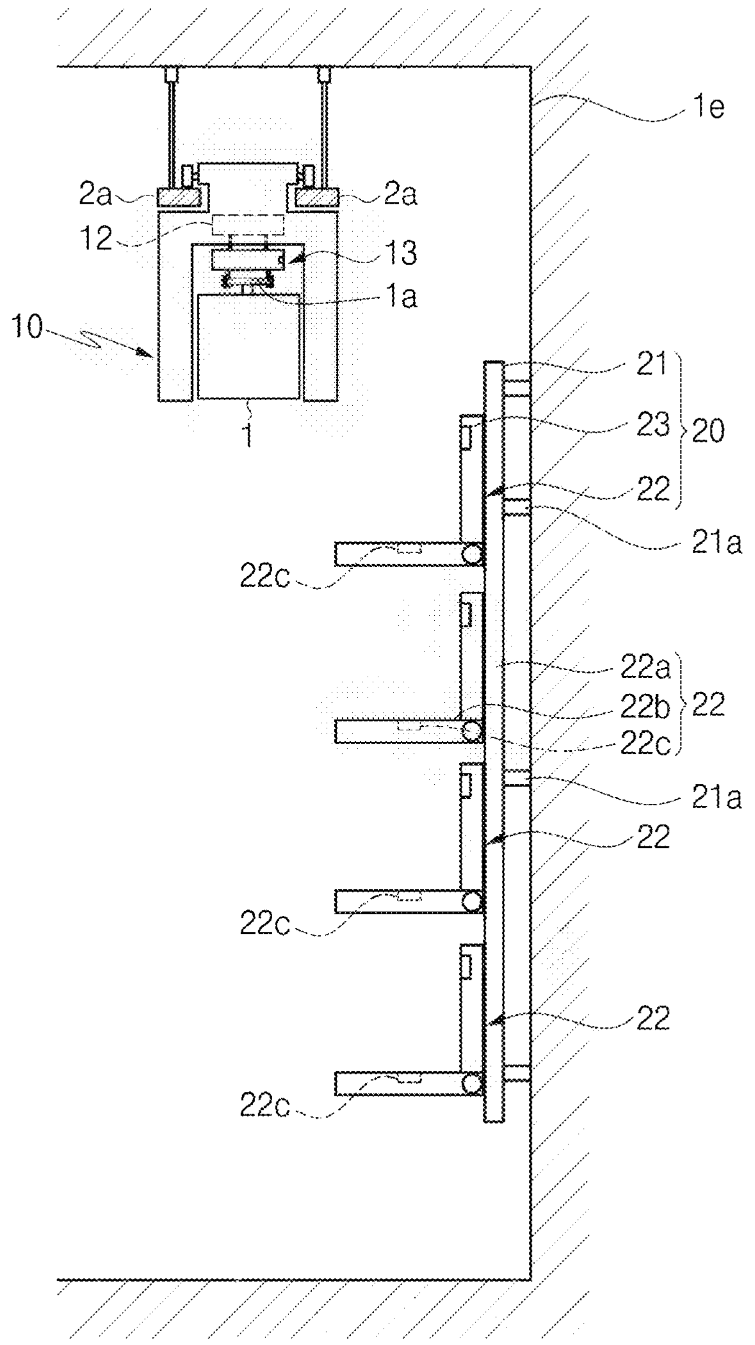
FIG. 7 is a side view of a modified example of a support part illustrated in FIG. 1.

FIG. 1 is a side view schematically illustrating a substrate transfer device according to an exemplary embodiment of the present invention. FIG. 2 is a front view of the substrate transfer device illustrated in FIG. 1. FIG. 3 is a configuration diagram illustrating an electronic connection relationship of the substrate transfer device illustrated in FIG. 1. FIG. 4 is an enlarged side view of an Overhead Hoist Transport (OHT) illustrated in FIG. 1. FIG. 5 is an enlarged front view of a shelf part illustrated in FIG. 2. FIG. 6 is a side view of a modified example of the shelf part illustrated in FIG. 1. FIG. 7 is a side view of a modified example of a support part illustrated in FIG. 1.

As illustrated in FIGS. 1 to 7, a substrate transfer device according to an exemplary embodiment of the present invention includes an Overhead Hoist Transport (OHTO, a loading unit 20, and an OHT Control System (OCS) 30.

The OHT 10 is a device that autonomously travels along a rail 2*a* to transfer a container 1 between semiconductor facilities. In this case, a plurality of substrates (not shown) are mounted in the container 1, and the container 1 protects the plurality of substrates from impacts, such as vibration. The container 1 may be formed of a FOUP on which multiple containers 1 are mounted. In addition, the container 1 may be further formed with an attachment port 1*a* for attaching a gripper unit 13 to the upper portion of a main body. In this case, the attachment port 1*a* provides an attachment area where attachment is possible. For example, the attachment port 1*a* may form an attachment area capable of attachment, such as a 'T' shape. In this case, the OHT 10 transfers the container in a state of being attached to the attachment port 1*a* when transferring the container 1, and the attachment to the attachment port 1*a* is released to unload the container 1 when the container 1 is unloaded.

As an example of the OHT 10, the OHT 10 includes a main body 11, a lifting/lowering unit 12, and a gripper unit 13.

The main body 11 is driven and moves along the rail 2*a*. For example, the main body 11 includes a driving wheel part 11*a* that is in close contact with the upper surface of the rail 2*a*, and a traveling motor unit 11*b* that rotates the driving wheel part 11*a* in conjunction with the driving wheel part 11*a*, and a driving control unit Ile that drives the traveling motor unit 11*b* according to a free travel algorithm to rotate the driving wheel part 11*a*. In addition, the main body 11 may further include a lidar sensor (not shown) that detects obstacles during traveling, generates a detection signal, and transmits the generated detection signal to the driving motor unit 11*b* to stop traveling. In addition, the main body 11 may further include a power supply unit (not shown) that wirelessly charges power and a wireless communication unit (not shown) that communicates with the OCS 30 to transmit and receive location information and logistics information of the container 1. However, in the present invention, the configuration of the main body 11 is not limited to the above-mentioned configuration, and the main body 11 is driven on the rail 2*a* according to the logistics scheduling of the OCS 30, so that the present invention may be modified and implemented into to various autonomous transport devices capable of transferring the container 1 as a matter of course.

The lifting/lowering unit 12 is coupled to the main body 11 and is driven to move up and down in a down direction.

As an example of the lifting/lowering unit 12, the lifting/lowering unit 12 includes a belt 12*a* that moves up and down the gripper unit 13, and a valve driving unit 12*b* that moves the gripper unit 13 up and down in conjunction with the belt 12*a* by winding or unwinding the belt 12*a*. In addition, the lifting/lowering unit 12 may be configured to further include an electric wire (not shown) coupled to the belt 12*a* and electrically connected to the gripper unit 13. Here, the electrical wire allows a control signal that controls the gripping drive of the gripper unit 13 to be transmitted to and received from the main body 11, and a tag signal read by a tag reader 13*c* to be transmitted to and received from the main body 11. However, in the present invention, the raising and lowering method of the lifting/lowering unit 12 is not limited to the above-mentioned configuration, and the lifting/lowering unit 12 may be modified and implemented in various forms for moving up and down the gripper unit 13 as a matter of course.

The gripper unit 13 may be coupled to the lifting/lowering unit 12 to grip the container 1 or release the gripping, and may read location information of the container 1, status information of the container 1, ID information of the container 1, and substrate information mounted on the container 1, and transmit the read information to the OCS 30.

As an example of this gripper unit 13, the gripper unit 13 may include a tongs driving unit 13*a* for gripping the attachment port 1*a* formed at the top of the container 1 in the form of tongs, and a fastening driving unit 13*b* that is connected to the tongs driving unit 13*a* and releases the attachment so that the tongs driving unit 13*a* retracts and is fastened to the attachment port 1*a*. However, of course, in the present invention, the attachment method of the gripper unit 13 may be modified and implemented in any form that can be fastened to the attachment port 1*a* formed at the top of the container 1. The gripper unit 13 may be controlled by the OCS 30 to be attached to and detached from the attachment port 1*a* of the container 1. Additionally, the gripper unit 13 may further include the tag reader 13*c*. The tag reader 13*c* may read a tag signal in conjunction with a location information providing unit 23 and obtain location information of the gripper unit 13 based on the read tag signal. In this case, the location information obtained from the tag reader 13*c* may be transmitted to the OCS 30 through the main body 11 of the OHT 10.

The loading unit 20 provides a loading area 20*a* in which the container 1 is loaded with a plurality of layers. Accordingly, since the loading unit 20 forms the loading area 20*a* in the form of multiple layers, more containers 1 may be mounted compared to the related art. Here, the loading area 20*a* may be formed in a variety of ways, such as a shelf type for seating the container 1, or an attachment type for attaching the container 1 and fixing the location of the container 1 at a specific location. In this case, when the loading unit 20 does not need to load the container 1 or when it is desired to secure work space, the loading area 20*a* is folded based on one point, thereby making the loading area 20*a* a workable space. For example, when the semiconductor facility is moved, space for the semiconductor facility to move may be secured by folding the loading area 20*a* along existing on the path along which the semiconductor facility moves. In this way, the loading unit 20 forms the loading area 20*a* in the form of the plurality of layers, so that multiple containers 1 may be mounted even in a narrow space, and may be folded as needed to reduce the space occupied by the loading unit 20. In this way, the loading unit 20 forms the multi-layered loading area 20*a*, and the multi-layered loading area 20*a* may be folded to secure space.

As an example of the loading unit 20, the loading unit 20 may be configured to include a support part 21, a shelf part 22, and a location information providing unit 23.

The support part 21 is fixed and installed within the semiconductor fab to provide an area where the shelf part 22 is to be fixed. As an example of this support part 21, the support part 21 may be installed with its upper end connected to a ceiling surface 1*e* in the semiconductor fab and its lower end connected to a floor surface 1*d* in the semiconductor fab. In this case, the upper end and the lower end of the support part 21 may be coupled to each other by fastening members 21*a* installed in the semiconductor fab. Here, the fastening member 21*a* may be coupled by selectively combining fastening elements, such as wires, anchor bolts, turn buckles, and fastening brackets. However, in the present invention, the fastening member 21*a* is not limited to the above example, and of course, the fastening member 21*a* may be modified into any form capable of fixing the upper end and the lower end of the support part 21. In this way, since the support part 21 is fixed to the ceiling surface 1*e* and the floor surface 1*d* in the semiconductor fab, the multi-layered container 1 is prevented from easily shaking due to vibration and the like even when the multi-layered container 1 is loaded in the loading area 20*a*. When the support part 21 is coupled only to the ceiling surface 1*e* or is seated on the floor surface 1*d*, vibration occurs when loading and unloading the container 1, thereby damaging the substrate inside the container 1. In particular, when the support part 21 is configured to be seated only on the floor surface 1*d*, in order to minimize the influence of shaking that occurs when loading and unloading the container 1, a very heavy vibration reduction design element, such as a surface plate, needs to be added. However, adding the vibration reduction design element takes up a lot of space and a moving operation is also very difficult. However, the support part 21 illustrated in the present invention is formed in a structure that is coupled to one side of the shelf part 22 and coupled to the inside of the semiconductor fab. Accordingly, the support part 21 may minimize the space occupied by the loading unit 20 when the loading area 20*a* is folded and minimize the influence of shaking during transferring and loading of the container 1.

The space remaining when the loading area 20*a* is folded may be used for other purposes. When the support part 21 is configured in the form of a frame surrounding the shelf part 22, the frame occupies space, and it is impossible to provide the advantage of utilizing space as exemplified in the present invention.

In addition, the support part 21 may be installed by being connected to a wall surface 1*e* within the semiconductor fab in addition to being connected between the ceiling surface 1*e* and the floor surface 1*d* within the semiconductor fab as described above. In this case, the support part 21 may be coupled to the wall surface 1*e* within the semiconductor fab by the fastening member 21*a*. However, in the present invention, the coupling method between the support part 21 and the wall surface 1*e* is not limited to the above-mentioned method, and the coupling method between the support part 21 and the wall surface 1*e* may be implemented in various modifications. In this way, the support part 21 coupled to the wall surface 1*e* may be disposed on only one side of the shelf part 22. Therefore, the support part 21 installed on the wall surface 1*e* may minimize shaking when the plurality of containers 1 is loaded in the multi-layer loading area 20*a*, and when the loading area 20*a* is folded, the loading area 20*a* may be changed to usable space.

The shelf parts 22 are formed in plural, and a loading area in which the container 1 is loaded is formed on each of the plurality of shelf parts. In addition, the plurality of shelf parts 22 is installed to be spaced apart from the upper part to the lower part of the support part 21. Such the loading area 20*a* rotates and is folded, the shelf part 22 may use the loading area 20*a* as a space that may be utilized for other purposes.

As an example of such the shelf part 22, the shelf part 22 may include a base part 22*a*, a rotary loading part 22*b*, and a loading detection sensor 22*c*.

The base parts 22*a* are formed in plural, and the plurality of base parts 22*a* are installed to be spaced apart from each other from the upper part to the lower part of the support part 21. The base part 22*a* may be formed in a plate shape. In this case, the base part 22*a* is coupled with the support part 21 and serves to support the rotary loading part 22*b*. The base part 22*a* is illustrated as having a plate shape, but of course, the base part 22*a* may be modified into various shapes that can be coupled with the rotting loading part 22*b* as needed. Meanwhile, the base part 22*a* may be further formed with a stopper (not shown) that limits the rotation range of the rotary loading part 22*b* so that the rotary loading part 22*b* rotates only to a specific angle when the rotary loading part 22*b* rotates. Accordingly, the rotary loading part 22*b* may only rotate up to a specific angle from the base part 22*a* during rotation. Accordingly, as illustrated in the drawing, the rotation angle of the rotary loading part 22*b* may be limited by the stopper so that the rotary loading part 22*b* rotates only to a range forming a right angle between the base and the rotary loading part 22*b*.

The rotary loading parts 22*b* are formed in plural, and the loading area 20*a* in which the container 1 is loaded is formed in each of the plurality of rotary loading parts 22*b*. Additionally, the plurality of rotary loading parts 22*b* is rotatably coupled to the base parts 22*a*, respectively. In this case, the rotary loading part 22*b* is folded with one end coupled to one end of the base part 22*a*. For example, the rotary loading part 22*b* may be rotated about a point and vertically folded while the surface on which the container 1 may be loaded is arranged in a horizontal state. Accordingly, the rotary loading part 22*b* may utilize the entire loading area 20*a* as another space. The rotary loading part 22*b* forms the loading area 20*a* where the container 1 is loaded, and when the container 1 is not loaded, the rotary loading part 22*b* rotates and is folded on the base part 22*a* under the control of the OCS 30 or a separate controller (not shown).

As an example of the rotary loading part 22*b*, the rotary loading part 22*b* may be formed to include a loading plate 22*b*1, a sliding transfer body 22*b*2, and a rotary driving unit 22*b*3.

The loading plate 22*b*1 is rotatably coupled to the base part 22*a* and the container 1 is loaded. The loading plate 22*b*1 may be slidably coupled to the sliding transfer body 22*b*2 on its upper surface. For example, the loading plate 22*b*1 may be slidably coupled with the sliding transfer body 22*b*2 by a guide to slide in one direction. Also, the loading plate 22*b*1 may have an insertion region formed on an inner side in which the sliding transfer body 22*b*2 is slidably inserted. Furthermore, the loading plate 22*b*1 may be further formed with an anti-slip element that reduces friction in the region where the loading plate 2*b*1 is in contact with the sliding transfer body 22*b*2. For example, the anti-slip element may be formed as a ball bearing or a linear bearing. Furthermore, the loading plate 22*b*1 may be formed in the shape of a frame with a hollow region formed therein, as needed, to prevent the shape from being deformed by the weight of the container 1 while providing structural strength. However, the present invention does not limit the shape of the loading plate **22*b*1 to the above example, and the loading plate 22*b*1 may be transformed into any shape capable of loading the container 1 as a matter of course. Here, the vertical upper region of the loading plate 22*b*1 is formed so that the container 1 loaded on the OHT 10 is not disposed. Thus, the OHT 10 does not interfere with the loading plate 22*b*1 when the container 1 is loaded onto the sliding transfer body 22*b*2**.

The sliding transfer body **22*b*2 is slidably coupled with the loading plate 22*b*1 and is slidably driven in one direction of the loading plate 22*b*1. The sliding transfer body 22*b*2 may be formed with various types of actuators that may be driven forward and backward from the loading plate 22*b*1 to move the plate. For example, the sliding transfer body 22*b*2 may be modified and implemented in the form of a linear motor or pneumatic actuator or ball screw motor to move the plate. However, the present invention does not limit the configuration of the sliding transfer body 22*b*2 to the above-mentioned example, and it is of course possible that the loading area 20*a* for loading the container 1 may be transformed into any form that is capable of moving forward and backward. Furthermore, the sliding transfer body 22*b*2 is interlocked with the OCS 30, and when a forward signal is input from the OCS 30, the sliding transfer body 22*b*2 is driven forward to move forward in one direction from the loading plate 22*b*1. Also, when the sliding transfer body 22*b*2 receives a reverse signal from the OCS 30, the sliding transfer body 22*b*2 is driven backward to move backward to the inner side of the loading plate 22*b*1. Furthermore, the sliding transfer bodies 22*b*2 may be formed in plural and stacked one on top of the other. Accordingly, the number of strokes that the sliding transfer bodies 22*b*2 may move forward increases depending on the number of sliding transfer bodies 22*b*2. Thus, the loading unit 20 may vary the number of sliding transfer bodies 22*b*2** according to design specifications, thereby varying the travel distance.

The rotary driving unit **22*b*3 is installed at a rotation point between the base part 22*a* and the rotary loading part 22*b*, and rotates the rotary loading part 22*b* of the shelf part 22 toward the base part 22*a* to fold the rotary loading part 22*b* according to a rotation angle. The rotary driving unit 22*b*3 may be formed of a rotatable actuator, such as a geared motor or a pneumatic rotary cylinder, and may be implemented in various variations, such as a method of folding the folding link with a pneumatic cylinder. However, the present invention does not limit the rotating drive unit 22*b*3 to the above example, and it is of course that the rotary driving unit 22*b*3 may be implemented in any form capable of rotating the shelf part 22. When the rotary driving unit 2263 is interlocked with the OCS 30 and receives an unfolding signal input from the OCS 30, the rotary loading part 22*b* is rotated toward the base part 22*a* and folded. In addition, when the rotary driving unit 22*b*3 receives a folding signal input from the OCS 30, the rotary driving unit 22*b*3 rotates the rotary loading part 22*b* from the base part 22*a* side so that the angle between the rotary loading part 22*b* and the base part 22*a*** forms a certain angle.

The loading detection sensor **22*c* is installed on at least one of the sliding transfer body 22*b*2 and the loading plate 22*b*1 and detects the container 1 when the container 1 is loaded. The loading detection sensor 22*c* may be configured as an object detection sensor capable of detecting a loaded state of the container 1. The loading detection sensor 22*c* may be formed by an object detection sensor, such as an ultrasonic sensor, a photo sensor, and a lidar sensor that can detect objects. However, the present invention does not limit the loading detection sensor 22*c* to the above examples, and it is of course understood that the loading detection sensor 22*c* may be implemented as any form of sensor capable of detecting the container 1. The loading detection sensor 22*c* detects the container 1 when the container 1 is loaded and generates a loading signal. In this case, the loading signal is transmitted to the OCS 30, and the OCS 30 receiving the loading signal recognizes that the container 1 is loaded when the loading signal is input. Furthermore, the OCS 30 recognizes that the container 1 is not loaded when the loading signal is not input. Furthermore, the loading detection sensor 22*c* may generate a folding signal in conjunction with the location information provision unit 23 when the rotary loading part 22*b* is folded onto the base part 22*a*. In this case, a folding signal may be input to the OCS 30 to detect the folded state. Here, the folding signal may be generated by further configuring a detection sensor (not shown) that is separate from the purpose of the loading detection sensor 22*c***.

As mentioned above, the loading units 20 are formed in plural and are arranged in at least two rows. Thus, the loading unit 20 may secure a loading capacity that is much larger than the loading capacity of a sidetrack buffer that loads only a few containers 1 in the related art. In this case, the plurality of loading units 20 allows the loading area **20*a* to be utilized for other purposes when necessary, since the loading area 20*a*** is folded as needed.

The location information providing unit 23 is installed around each of the loading areas **20*a*. For example, the location information providing unit 23 may be installed while being coupled to at least one of the shelf part 22, the base part 22*a*, or the support part 21. The location information providing unit 23 may be formed of an RFID tag containing location information. The location information providing unit 23 provides identification information for each of the loading areas 20*a* so as to distinguish the loading areas 20*a* from each other. In addition, the location information providing unit 23 provides location information to the tag reader 13*c* of the gripper unit 13 of the OHT 10, so that the OHT 10 and the OCS 30 may detect the location of the height of the gripper unit 13 when the gripper unit 13 moves up and down. Thus, when the OHT 10 moves up and down the gripper unit 13 to load the container 1 in the loading area 20*a*, the OHT 10 may check the raised and lowered position of the gripper unit 13** through the location information.

The OCS 30 is interlocked with the OHT 10 that transfers the container 1 along the rail **2*a*, the loading detection sensor 22*c*, the sliding transfer body 22*b*2, and the rotary driving unit 22*b*3. In this case, the OCS 30 performs wired and wireless communication with the OHT 10, the loading detection sensor 22*c*, the sliding transfer body 22*b*2, and the rotary driving unit 22*b*3 to be interlocked with the OHT 10, the loading detection sensor 22*c*, the sliding transfer body 22*b*2, and the rotary driving unit 22*b*3**.

In addition, the OCS 30 may receive location information of the OHT 10, status information of the OHT 10, and logistics information of the OHT 10 when is interlocked with the OHT 10 to monitor the location information of the OHT 10, the status information of the OHT 10, and the logistics information of the OHT 10. In addition, the OCS 30 may generate scheduling information of the container 1 and deliver the generated scheduling information to the OHT 10. In this case, the OCS 30 transfers the container 1 to each of the semiconductor manufacturing facilities (not illustrated) in accordance with the scheduling information.

Further, the OCS 30 is formed including port information for each of the loading areas 20a of the loading unit 20. Here, the port information is information for identifying each of the loading areas 20a of the loading unit 20, and is formed as a unique number for each of the loading areas 203.

Furthermore, the OCS 30 temporarily accommodates the container 1 in each of the loading areas 20a of the loading unit 20 when the semiconductor manufacturing facility is in a state where the semiconductor manufacturing facility cannot handle the process when the container 1 is transferred to the semiconductor manufacturing facilities. In this case, when the OCS 30 transfers the container 1 to the loading area 20a of the loading unit 20, the presence or absence of the container 1 is determined by a loading signal to the loading detection sensor 22c. In this case, the OCS 30 sets the loading area 20a in which the loading signal is not generated as an area in which the container 1 may be mounted. Furthermore, the OCS 30 determines the loading area 20a in which the loading signal is generated as the area in which the container 1 is mounted. In this case, the OCS 30 transfers the container 1 in the loading area 20a in which the loading signal is generated according to the scheduling information of the container 1.

Further, the OCS 30 is interlocked with the sliding transfer body 22b2 through wired/wireless communication to control the sliding transfer body 22b2 to be driven forwardly in one direction from the loading plate 22b1, and to control the sliding transfer body 2262 to be inserted into the insertion area of the loading plate 22b1.

Furthermore, the OCS 30 controls the driving of the rotary driving unit 22b3 by wired or wireless communication to control the rotary loading part 22b to rotate on the base part 22a to form a certain angle. In this case, the OCS 30 may control the driving of the rotary driving unit 22b3 to control the rotary loading part 22b to be folded onto the base part 22a when there is no loading signal from the loading detection sensor 22c.

Further, the OCS 30 controls the lifting/lowering unit 12 of the OHT 10 to lower the container 1. Thus, the OCS 30 is able to load the container 1 attached to the OHT 10 onto the sliding transfer body 22b2. Furthermore, the OCS 30 controls the lifting/lowering unit 12 of the OHT 10 to lift the container 1 loaded on the sliding transfer body 2262.

In addition, the OCS 30 controls the gripper unit 13 of the OHT 10 to grip the container 1 or to release the gripping of the container 1.

Hereinafter, a substrate transfer method according to an exemplary embodiment of the present invention as described above will be described.

In the following substrate transfer method, <a substrate transfer method when loading the container 1>, <a substrate transfer method when unloading the container 1>, and <a substrate transfer method when folding the loading area 20a> will be described respectively.

<Substrate Transfer Method when Loading the Container 1>

Figure 8:
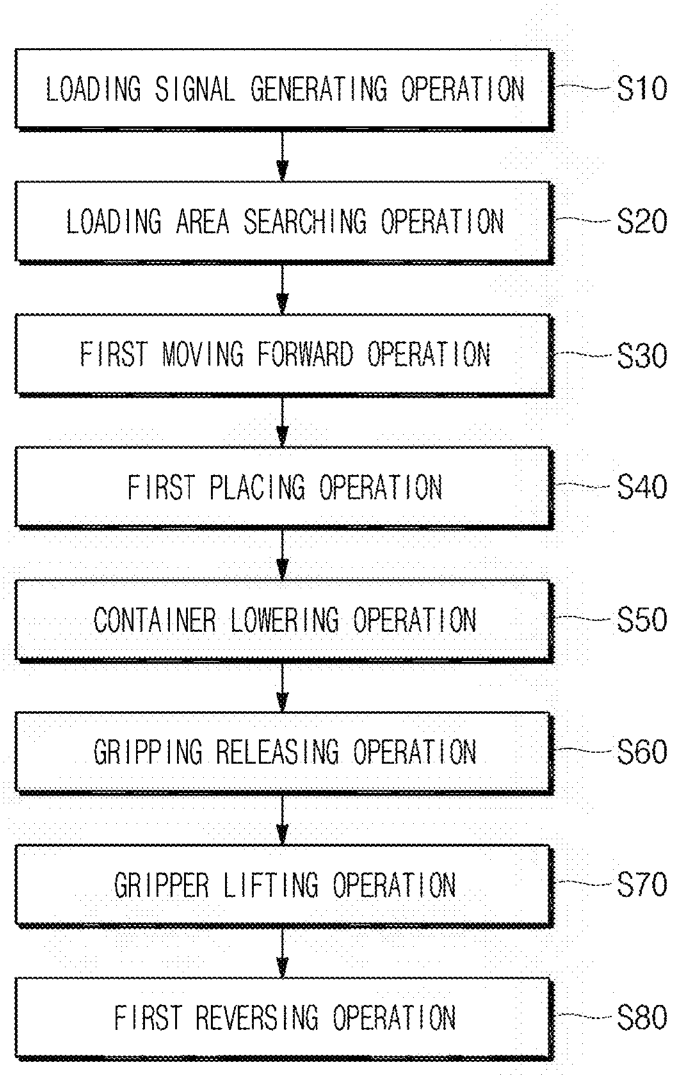
FIG. 8 is a flowchart of a substrate transfer method according to an exemplary embodiment of the present invention when a container is loaded.
Figure 9:
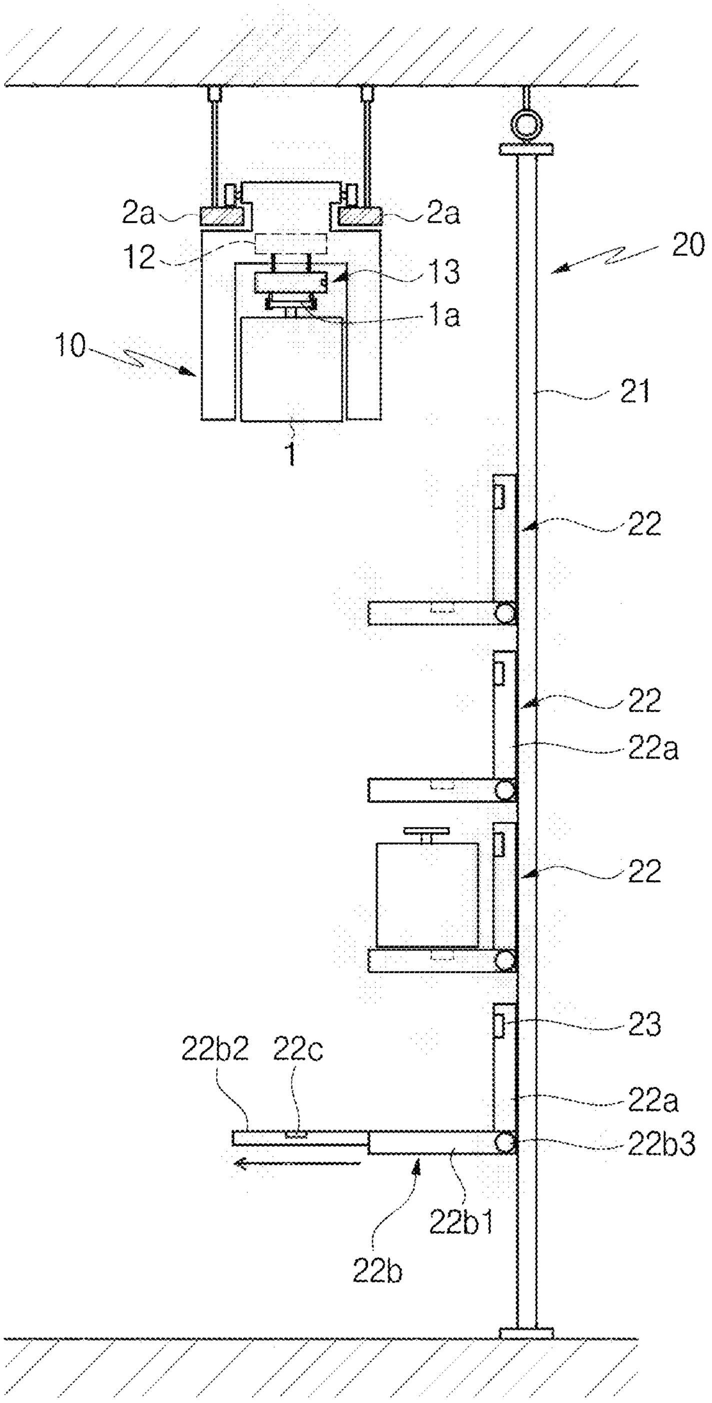
FIGS. 9 to 11 are driving diagrams according to the substrate transfer method illustrated in FIG. 8.
Figure 10:
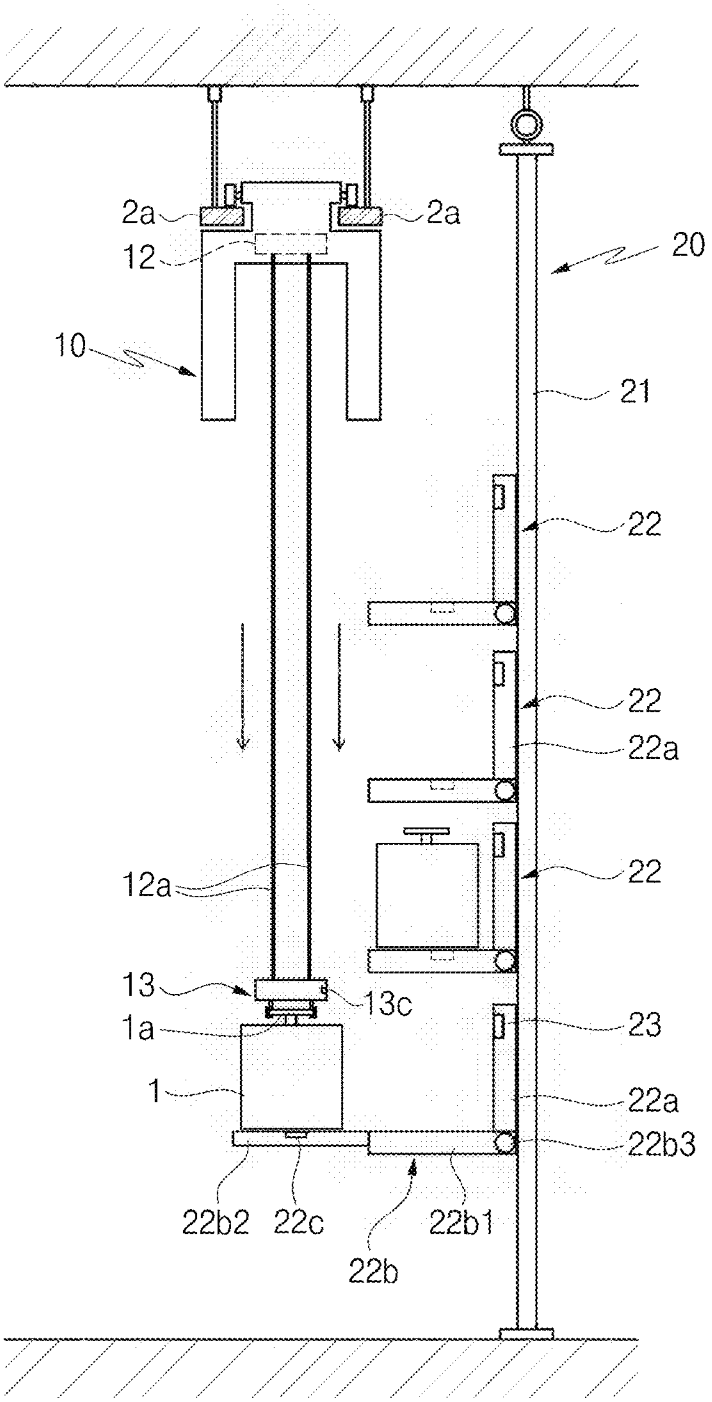
Figure 11:
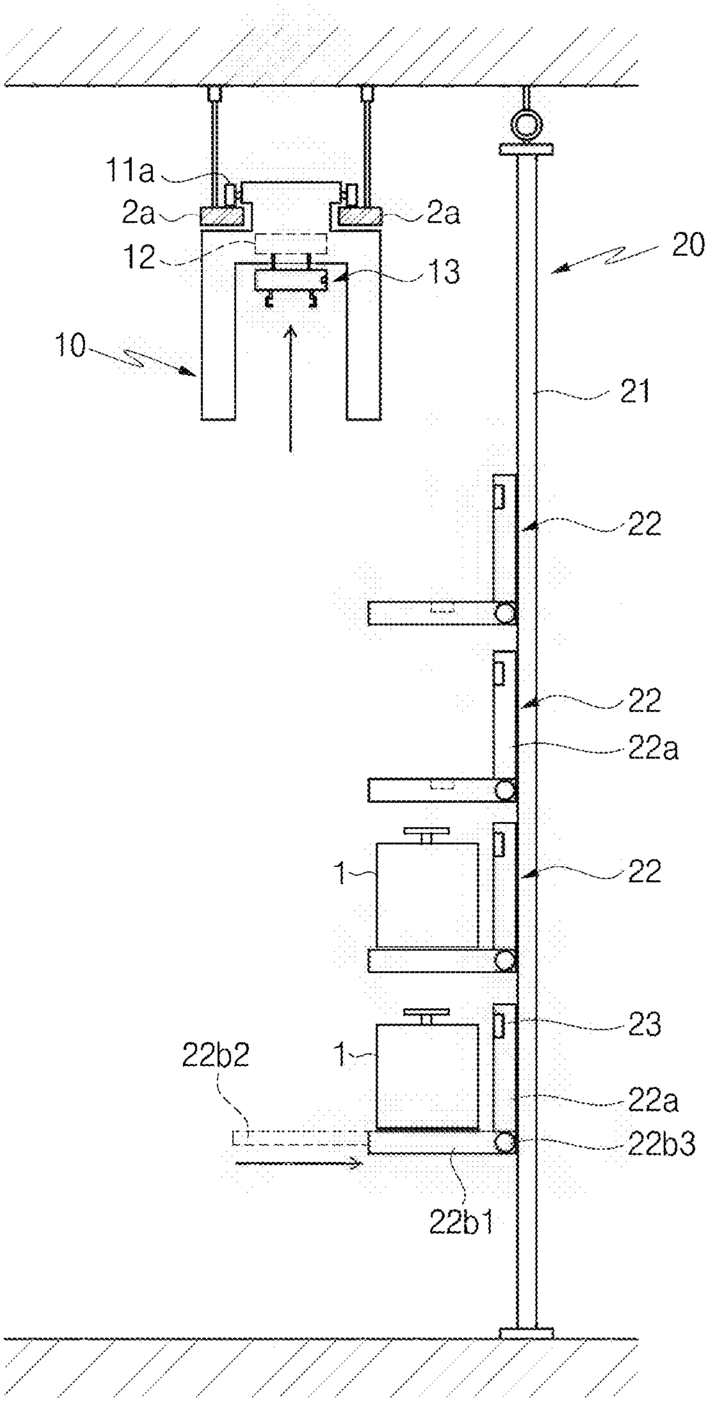

FIG. 8 is a flowchart of a substrate transfer method according to an exemplary embodiment of the present invention when the container 1 is loaded. FIGS. 9 to 11 are driving diagrams according to the substrate transfer method illustrated in FIG. 8.

Referring further to FIGS. 8 to 11, a substrate transfer method according to an exemplary embodiment of the present invention may include a loading signal generating operation S10, a loading area searching operation S20, a first moving-forward operation S30, a first placing operation S40, a container lowering operation S50, a gripping releasing operation S60, a gripper lifting operation S70, and a first reversing operation S80.

First, in the loading signal generating operation S10, a loading signal is transmitted to the OCS 30 from each of the loading detection sensors 22c.

Next, in the loading area searching operation S20, the OCS 30 determines whether the container 1 is loaded in the loading areas 20a of the loading unit 20 based on the presence or absence of the loading signal, and searches for the loading areas 20a in which the container 1 can be loaded. In this case, the OCS 30 continuously monitors the loading signal to determine whether the container 1 is loaded or unloaded in each of the loading areas 20a. In this case, the OCS 30 receives the port information of the loading areas 20a that are in an unloaded state, and generates a loading order for each of the loading areas 20a that are in the unloaded state so that the container 1 is loaded in the loading order.

Next, in the first moving forward operation S30, the OCS 30 controls the sliding transfer body 22b2 to select one of the sliding transfer bodies 22b2 that is not loaded with the container 1 and move the selected sliding transfer body 22b2 to one side. Then, the sliding transfer body 22b2 moves forward to one side from the loading plate 22b1, as illustrated in FIG. 9.

Next, in the first placing operation S40, the OCS 30 controls the OHT 10 to place the OHT 10 in the upper portion where the sliding transfer body 22b2 is located. In this case, the OHT 10 receives a loading command to load the container 1 and the port information of the loading area 20a from the OCS 30, and stops in the vertical upper space of the loading area 20a corresponding to the port information. In addition, the OHT 10 may acquire location information through a stop tag (not shown) attached to each section of the rail 2a, and determine a stopping location with the acquired location information.

Next, in the container lowering operation S50, as illustrated in FIG. 10, the OCS 30 controls the OHT 10 to seat the container 1 on the sliding transfer body 22b2. In this case, the OHT 10 may lower the container 1 and the gripper unit 13 to the top of the sliding transfer body 22b2 by driving the lifting/lowering unit 12 to cause the belt 12a to unwind, as described above. In this case, in the container lowering operation S50, at the time of lowering of the gripper unit 13, the tag reader 13c reads the location information of the location information providing units 23, and based on the read information, the position of the raised/lowered height of the gripper unit 13 may be detected. Thus, the OHT 10 and the OCS 30 may obtain height information for each of the loading areas 20a at the time of moving up and down. Furthermore, in the container lowering operation S50, when the container 1 is loaded on the sliding transfer body 22b2, the loading detection sensor 22c generates a loading signal, and the OCS 30 receives the loading signal from the loading detection sensor 22c and changes the loading information to the state in which the container 1 is mounted in the corresponding loading area 20a.

Next, in the gripping releasing operation S60, the OCS 30 controls the OHT 10 to release the gripping between the OHT 10 and the container 1. In this case, the gripping of the container 1 by the OHT 10 may be released by controlling the gripper unit 13 of the OHT 10 by the OCS 30.

Next, in the gripper lifting operation S70, the OCS 30 controls the OHT 10 to elevate the gripper unit 13 to the inside of the main body 11, as illustrated in FIG. 11.

Next, in the first reversing operation S80, the OCS 30 controls the sliding transfer body **22*b*2 to insert the sliding transfer body 22*b*2 in which the container 1 is seated into the loading plate 22*b*1**.

In this way, <the substrate transfer method upon loading the container 1> may load a container 1 in each of the loading areas **20*a* formed in a plurality of layers, thereby enabling a greater number of containers 1** to be mounted than the related art.

<Substrate Transfer Method when Unloading the Container 1>

Figure 12:
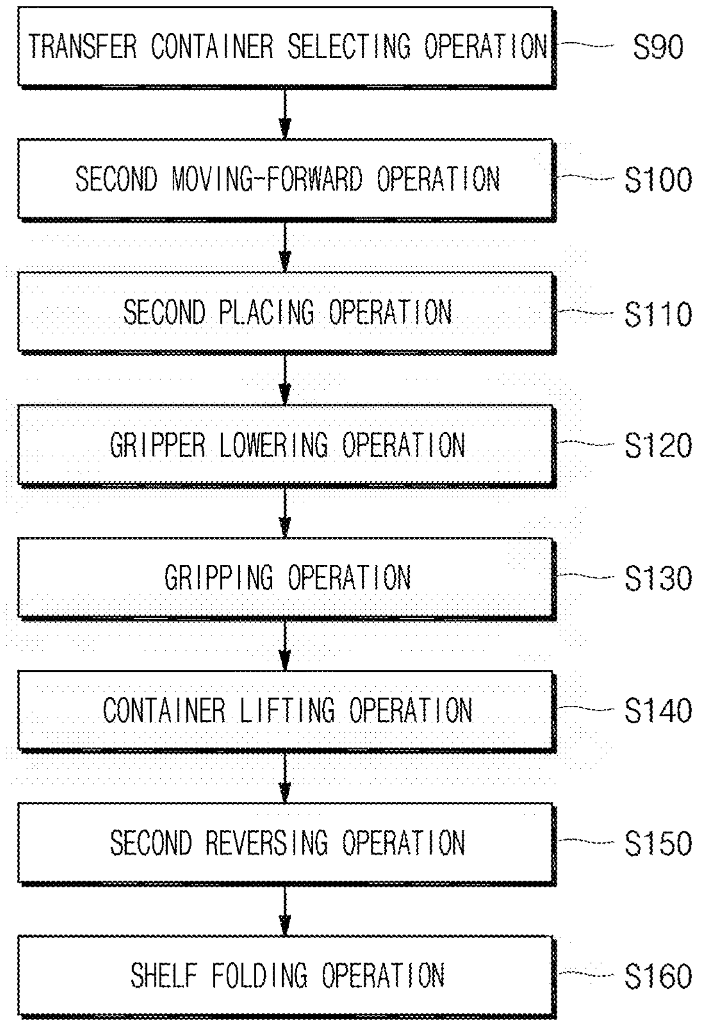
FIG. 12 is a flowchart of the substrate transfer method according to the exemplary embodiment of the present invention when a container is unloaded.
Figure 13:
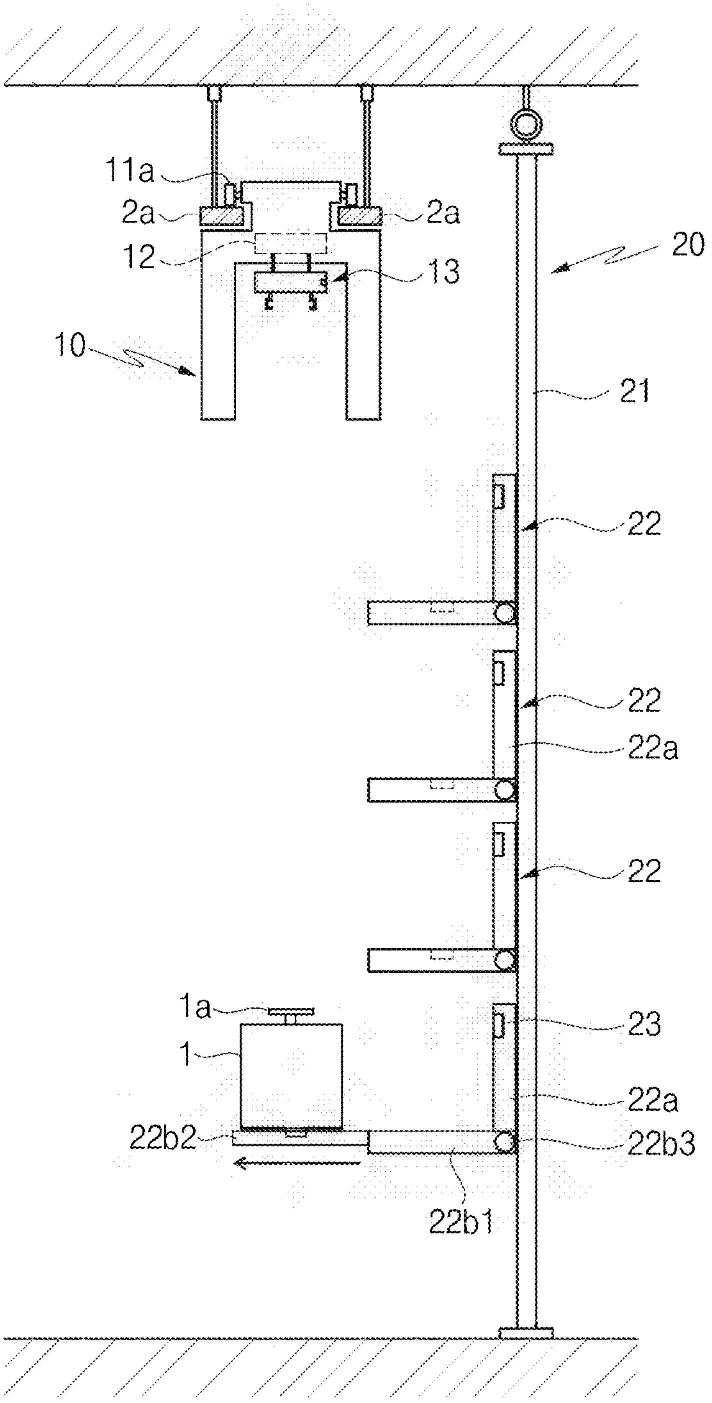
FIGS. 13 to 15 are driving diagrams according to the substrate transfer method illustrated in FIG. 12.
Figure 14:
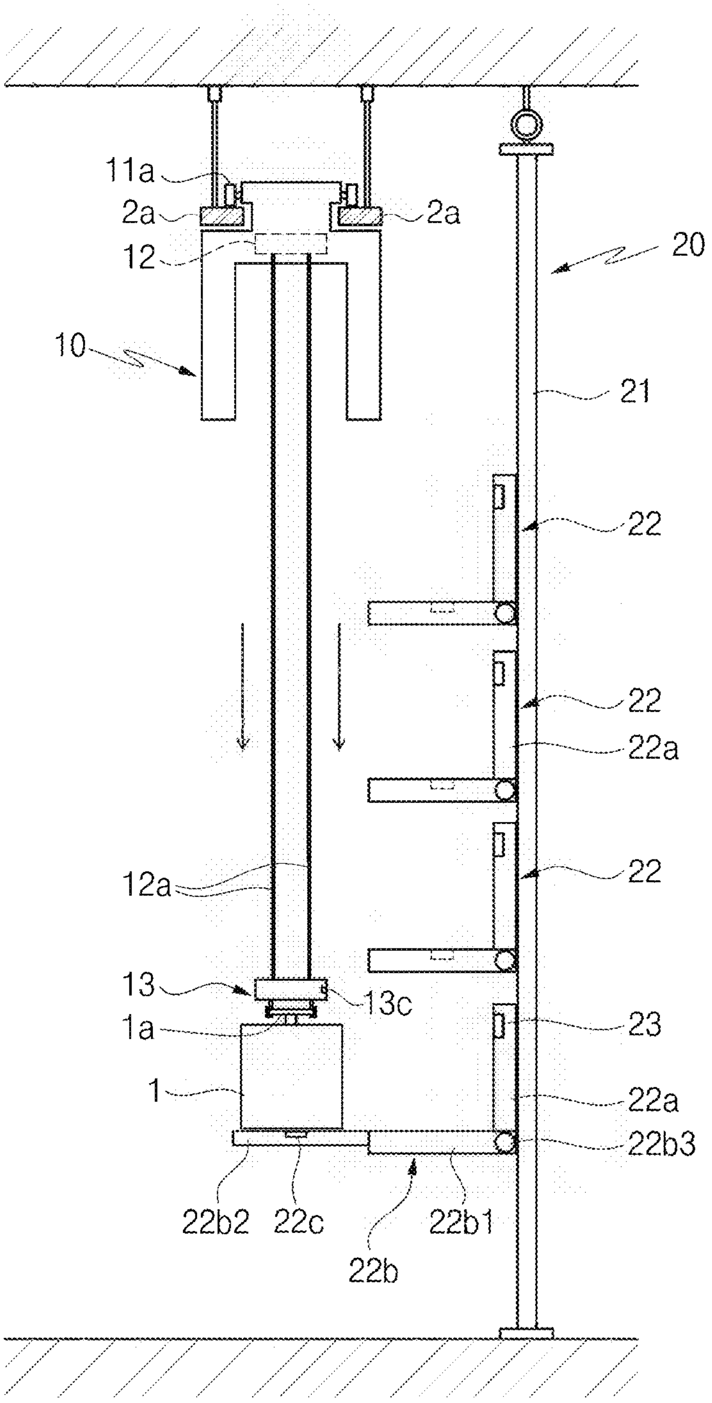
Figure 15:
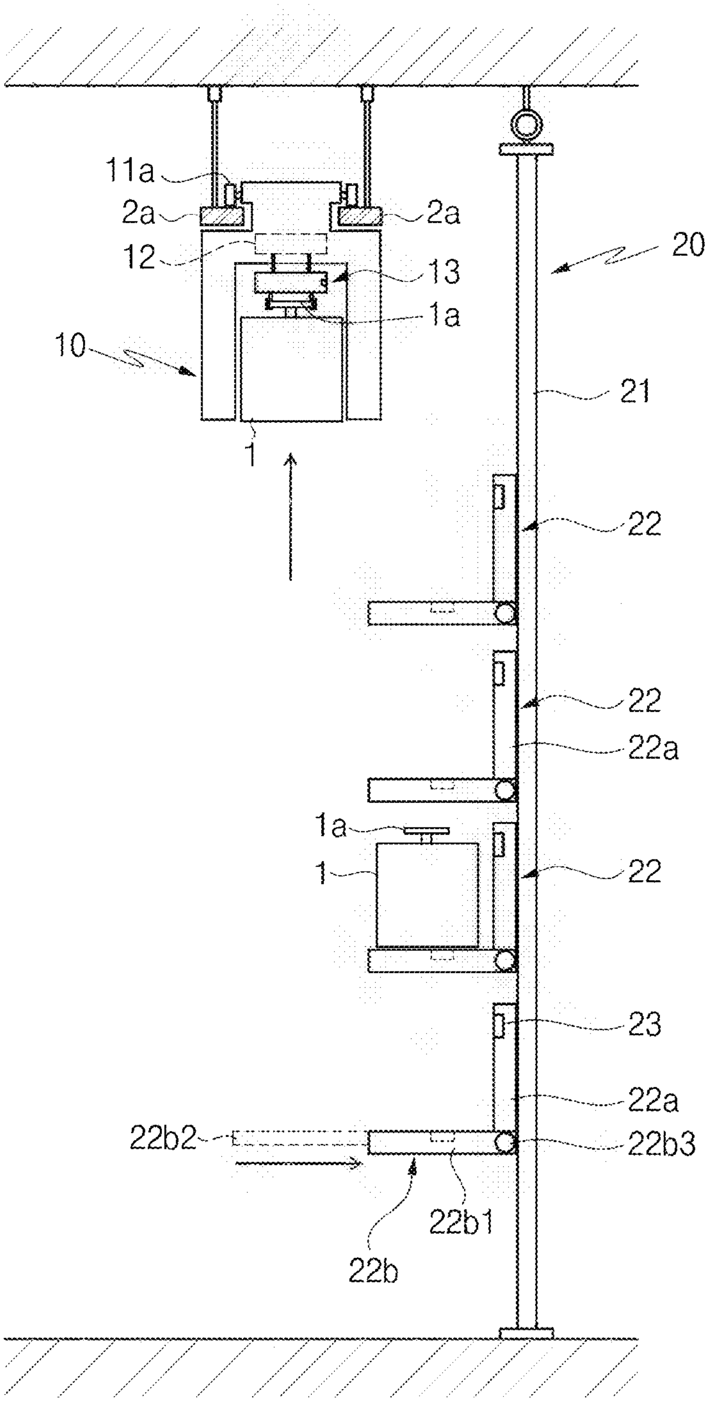

FIG. 12 is a flowchart of the substrate transfer method according to the exemplary embodiment of the present invention when a container is unloaded. FIGS. 13 to 15 are driving diagrams according to the substrate transfer method illustrated in FIG. 12.

Referring further to FIGS. 12 to 15, the substrate transfer method according to the exemplary embodiment of the present invention may further include a transfer container selecting operation S90, a second moving-forward operation S100, a second placing operation S110, a gripper lowering operation S120, a gripping operation S130, a container lifting operation S140, and a second reversing operation S150.

First, in the transfer container selecting operation S90, when a transfer command of the container 1 is input to the OCS 30 by the transfer scheduling, the OCS 30 selects one of the containers 1 placed in the loading areas **20*a* of the loading unit 20. In this case, the OCS 30 may select the container 1 in the order in which the order information about the order in which the containers 1 entered the loading areas 20*a* is earliest when selecting the container 1. Here, according to the transfer scheduling, the OCS 30 may monitor the process processing status of the semiconductor manufacturing facilities and continuously schedule the transfer of the container 1** according to the process processing status of the semiconductor manufacturing facilities.

Next, in the second moving-forward operation S100, the OCS 30 drives the sliding transfer body **22*b*2 on which the container 1 is seated to slide in one direction, as illustrated in FIG. 13, to move the container 1 selected in the transfer container selecting operation S90**.

Next, in the second placing operation S110, the OCS 30 controls the OHT 10 to place the OHT 10 on top of the container 1 selected in the transfer container selecting operation S90. In this case, the OHT 10 receives a return command to return the container 1 from the OCS 30 and the port information of the loading area **20*a*, and stops at the vertical upper space of the loading area 20*a* corresponding to the port information. In this case, the OHT 10 may acquire location information through a stop tag (not shown) attached to each section of the rail 2*a***, and determine a stop location with the acquired location information.

Next, in the gripper lowering operation S120, as illustrated in FIG. 14, the OCS 30 controls the OHT 10 to lower the gripper of the OHT 10 to the container 1 selected in the transfer container selecting operation S90. In this case, the OHT 10 may lower the gripper unit 13 to the top of the sliding container 1 by driving the lifting/lowering unit 12 to cause the belt **12*a* to be wound, as described above. Furthermore, in the gripper lowering operation S120, the tag reader 13*c* reads the location information of the location information providing units 23 at the time of lowering of the gripper unit 13, and based on the read information, the location of the raised/lowered height of the gripper unit 13 may be detected. Thus, the OHT 10 and the OCS 30 may obtain height information for each of the loading areas 20*a*** at the time of moving up and down.

Next, in the gripping operation S130, the OCS 30 controls the OHT 10 to cause the OHT 10 to grip the container 1. In this case, the OCS 30 controls the gripper unit 13 of the OHT 10 to cause the OHT 10 to grip the container as described above.

Next, in the container lifting operation S140, the OCS 30 controls the OHT 10 to lift the gripper unit 13 and the container 1 into the inside of the main body 11, as illustrated in FIG. 15.

Next, in the second reversing operation S150, the OCS 30 controls the sliding transfer body **22*b*2 to insert the sliding transfer body 2262 into the loading plate 22*b*1**.

In this way, the substrate transfer method when unloading the container 1> may easily unload the containers 1 loaded in multiple layers.

<Substrate Transfer Method when Folding the Loading Area **20*a***>

Figure 16:
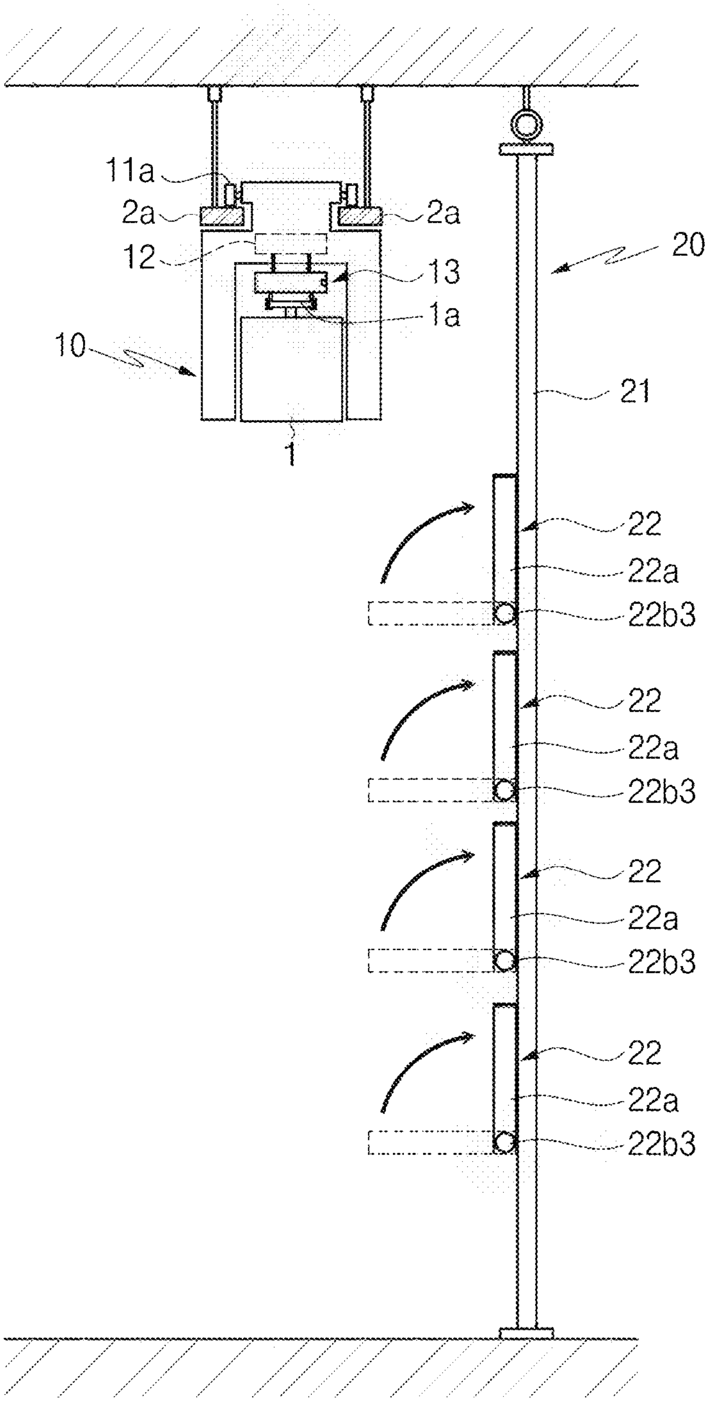
FIG. 16 is a driving diagram of the substrate transfer method according to the exemplary embodiment of the present invention when a loading area is folded.

FIG. 16 is a driving diagram of the substrate transfer method when the loading area **20*a*** is folded according to the exemplary embodiment of the present invention.

Referring further to FIG. 16, the substrate transfer method according to the exemplary embodiment of the present invention may further include a shelf folding operation S160.

As illustrated in FIG. 16, in a shelf folding operation S160, the OCS 30 folds the shelf part 22 onto the base part **22*a* when no loading signal is generated from all of the load monitoring sensors. Here, when the rotary loading part 22*b* is folded onto the base part 22*a*, the OCS 30 may drive the rotary driving unit 22*b*3 to fold the rotary loading part 22*b* onto the base part 22*a*, as described above. In addition, when the rotary loading part 22*b* is folded onto the base part 22*a*, the OCS 30 may fold the rotary loading part 22*b* onto the base part 22*a* automatically according to a predetermined algorithm, or manually by an operator manipulating the OCS 30**.

Thus, the substrate transfer method according to the exemplary embodiment of the present invention enables more containers 1 to be mounted in a multi-layered loading area **20*a*, thus enabling more containers 1 to be mounted in a small space, and enabling the loading area 20*a*** to be folded and utilized for other purposes as needed.

As described above, the present invention has been described with reference to the specific matters, such as a specific component, limited exemplary embodiments, and drawings, but these are provided only for helping general understanding of the present invention, and the present invention is not limited to the aforementioned exemplary embodiments, and those skilled in the art will appreciate that various changes and modifications are possible from the description.

Therefore, the spirit of the present invention should not be limited to the described exemplary embodiments, and it will be the that not only the claims to be described later, but also all modifications equivalent to the claims belong to the scope of the present invention.

What is claimed is:

1. A substrate transfer device, comprising:

an Overhead Hoist Transport (OHT) configured to transfer one of a plurality of containers while autonomously travelling along a rail; and a loading unit including loading areas in a plurality of layers, each one of the loading areas being configured to receive one of the plurality of containers, wherein the loading areas of each of the plurality of layers is configured to be folded about one point, wherein the loading unit further includes a support part fixedly installed within a semiconductor fab, and shelf parts, each one of the shelf parts including one of the loading areas, wherein the shelf parts are spaced apart from each other from a top to a bottom of the support part, each one of the loading areas being configured to rotate and fold, wherein each one of the shelf parts includes:

base parts, the base parts being spaced apart from the top to the bottom of the support part; and rotary loading parts, the rotary loading parts being rotatably coupled to the base parts, respectively, in which the container is loaded, wherein each of the rotary loading parts includes:

a loading plate which is rotatably coupled to each of the base parts and on which the container is loaded; and a sliding transfer body slidably coupled to the loading plate, the sliding transfer body being configured to be slidably driven in one direction of the loading plate, wherein the OHT is configured to lower the container directly onto the sliding transfer body in a state where the sliding transfer body moves forward from the loading plate.

2. The substrate transfer device of claim 1, wherein the support part includes an upper end connected to a ceiling surface within the semiconductor fab and a lower end connected to a floor surface within the semiconductor fab.

3. The substrate transfer device of claim 1, wherein the support part is connected to a wall surface in the semiconductor fab.

4. The substrate transfer device of claim 1, wherein the support part is coupled only to one side of the loading unit.

5. The substrate transfer device of claim 1, wherein each of the rotary loading parts further includes a rotary driving unit installed at a rotating point between each one of the base parts and the rotary loading parts, the rotary loading part being configured to rotate and fold the rotary loading part toward the base part according to a rotation angle.

6. The substrate transfer device of claim 5, wherein the shelf part further includes a loading detection sensor which is installed on the sliding transfer body and detects the container when the container is loaded and generates a loading signal.

7. The substrate transfer device of claim 6, further comprising:

an OHT Control System (OCS) which is interlocked with the loading detection sensor, the OHT, the sliding transfer body and the rotary driving unit, wherein the OCS is configured to receive the loading signal from the loading detection sensor and determine whether the container is loaded, the OCS being interlocked with the rotary driving to fold the entire rotary loading parts when one of the containers is not present within a respective one of the loading areas.

8. The substrate transfer device of claim 7, wherein the OCS is configured to cause each one of the containers to be loaded in a state where the sliding transfer body moves forward from the loading plate.

9. The substrate transfer device of claim 7, wherein the OCS is configured to receive a loading signal from the loading detection sensor when a respective one of the containers is loaded, and slides the sliding transfer body toward the loading plate when the loading signal is received.

10. The substrate transfer device of claim 1, further comprising:

a plurality of loading units that are identical to each other and are arranged in at least two rows, the loading unit being one of the plurality of loading units.

11. The substrate transfer device of claim 1, wherein the OHT includes:

a main body being configured to travel along a rail;

a lifting/lowering unit coupled to the main body, the lifting/lowering unit being configured to be driven up and down to the loading area; and a gripper unit coupled to the lifting/lowering unit, the gripper unit being configured to grip and release a respective one of the containers.

12. The substrate transfer device of claim 1, wherein a location of the loading area is varied within the loading unit when the container is loaded to or unloaded from the loading area.

13. A substrate transfer device comprising:

an Overhead Hoist Transport (OHT) including a main body configured to travel along a rail, a lifting/lowering unit coupled to the main body, the lifting/lowering unit being configured to be driven up and down to a loading area, and a gripper unit coupled to the lifting/lowering unit the gripper unit being configured to grip and release one of a plurality of containers;

a loading unit including loading areas in a plurality of layers, each one of the loading areas being configured to receive one of the plurality of containers, wherein the loading areas of each of the plurality of layers is configured to be folded about one point, wherein the loading unit further includes a support part with an upper end connected to a ceiling surface of a semiconductor fab, and a lower end connected to one of a floor surface or a wall surface of the semiconductor fab;

shelf parts, each one of the shelf parts including one of the loading areas, wherein the shelf parts are spaced apart from each other from a top to a bottom of the support part, each one of the loading areas being configured to rotate and fold, wherein each one of the shelf parts includes:

base parts, the base parts being spaced apart from a top to a bottom of the support part, rotary loading parts, the rotary loading parts being rotatably coupled to the base parts, respectively, in which the container is loaded, and a loading detection sensor on a sliding transfer body, the loading detection sensor for each one of the shelf parts being configured to detect when one of the containers is loaded on the rotary loading part and generate a loading signal;

wherein an OHT Control System (OCS) configured to cause load a respective one of the containers in a state where the sliding transfer body moves forward from a loading plate, receive a loading signal from the loading detection sensor when a respective one of the containers is loaded and slide the sliding transfer body to the loading plate when the loading signal is input, and is interlocked with the loading detection sensor and receives the loading signal from the loading detection sensor when a respective one of the containers is loaded to determine whether the container is loaded, and is interlocked with a rotary driving unit and folds the rotary loading part of a respective one of the shelf parts when a container is not present in the loading area, wherein the rotary loading part includes a loading plate which is rotatably coupled to the base part and on which the container is loaded, a sliding transfer body which is slidably coupled to the loading plate and is slidably driven in one direction of the loading plate, and the rotary driving unit installed at a rotating point between the base part and the rotary loading part to rotate and fold the rotary loading part toward the base part according to a rotation angle.

* * * * *